United States Patent [19]

Nakazato et al.

[11] Patent Number: 4,631,106
[45] Date of Patent: Dec. 23, 1986

[54] PLASMA PROCESSOR

[75] Inventors: Norio Nakazato, Kudamatsu; Yutaka Kakehi, Hikari; Takeshi Harada, Chiyoda; Ryoji Fukuyama; Makoto Nawata, both of Kudamatsu; Hironobu Ueda, Hitachi; Yutaka Omoto; Katsuaki Nagatomo, both of Kudamatsu; Fumio Shibata, Tokyo, all of Japan

[73] Assignee: Hitachi, Ltd., Tokyo, Japan

[21] Appl. No.: 777,725

[22] Filed: Sep. 19, 1985

[30] Foreign Application Priority Data

| Sep. 19, 1984 | [JP] | Japan | 59-194695 |
| Nov. 21, 1984 | [JP] | Japan | 59-244417 |
| Nov. 21, 1984 | [JP] | Japan | 59-244418 |
| Mar. 13, 1985 | [JP] | Japan | 60-48305 |
| May 15, 1985 | [JP] | Japan | 60-101229 |
| May 15, 1985 | [JP] | Japan | 60-101230 |
| May 15, 1985 | [JP] | Japan | 60-101231 |

[51] Int. Cl.$^4$ .................. H01L 21/306; B44C 1/22; C03C 15/00; C23F 1/00
[52] U.S. Cl. .................. 156/345; 156/643; 156/646; 204/298
[58] Field of Search .......... 204/192 EC, 192 E, 298; 156/345, 643, 646; 118/728, 50.1, 620; 427/38, 39

[56] References Cited

U.S. PATENT DOCUMENTS 4,526,643  7/1985  Okano et al. .................. 156/345

FOREIGN PATENT DOCUMENTS 58-53832  8/1983  Japan .................. 156/345

Primary Examiner—William A. Powell
Attorney, Agent, or Firm—Antonelli, Terry & Wands

[57] ABSTRACT

The present invention relates to a plasma processor, and the plasma processor comprises a processing chamber, means to reduce a pressure in the processing chamber so as to evacuate the interior thereof, means to introduce a processing gas into the processing chamber, means to generate an electric field within the processing chamber, and means to establish a magnetic field orthogonal to the electric field, this means being rotatable relative to a surface to-be-processed of a sample which is processed in a plasma arising under the action of the electric field and the magnetic field, whereby a space required for the movement of the means to establish the magnetic field orthogonal to the electric field can be reduced to miniaturize the processor, and the uniform processing of the sample can be attained using rotatable plasma.

12 Claims, 30 Drawing Figures

PLASMA PROCESSOR

BACKGROUND OF THE INVENTION

1. Field of the Invention

The present invention relates to plasma processors, and more particularly to a plasma processor which is well suited to turn a gas under vacuum into a plasma under the action of an electric field and a magnetic field and to process a sample such as semiconductor device substrate (hereinbelow, simply termed 'wafer') by means of ions or active species in the plasma.

2. Description of the Prior Art

A plasma processor, which turns a gas under vacuum into a plasma owing to the glow discharge and processes a sample owing to ions or active species in the plasma, has been used in various fields for ameliorating and working material surfaces and also for depositing a substance on a material surface.

It has been known that, when a magnetic field is exerted on the glow discharge based on an electric field, an electrical Coulomb force and an electromagnetic Lorentz force act. Especially with a construction wherein the electric field and the magnetic field intersect orthogonally, charged particles perform cycloidal motions, so that the frequency of collisions between particles or molecules increases to raise the density of ions or active species. With the aim of enhancing the processing rate, plasma processors applying this technique have also been proposed.

Plasma processors which employ both an electric field and a magnetic field are especially effective when applied to a sputtering apparatus, a dry etching apparatus and a vapor deposition apparatus which process substrates of silicon semiconductors and compound semiconductors. Among such plasma processors employing both the electric field and the magnetic field, an example applied to the sputtering apparatus is described in the official gazette of Japanese Patent Application Publication No. 54-32638, and an example applied to the dry etching apparatus is described in the official gazette of Japanese Patent Application Laying-open No. 58-16078.

By way of example, in the plasma processor described in the official gazette of Japanese Patent Application Laying-open No. 58-16078, a magnet element constructed of N- and S-poles is arranged under a lower electrode for placing a wafer thereon, so as to be capable of rectilinear reciprocations. In this plasma processor, a plasma based on an electromagnetic field is intensified between the N-pole and the S-pole, and the etching rate of that area of the surface to-be-processed of the wafer which has been exposed to the intensified plasma becomes particularly high. In this case, for the purpose of uniformly etching the surface to-be-processed of the wafer, the magnet element is rectilinearly scanned by a drive system so as to move the intense plasma region relative to the surface to-be-processed of the wafer. In this manner, with the plasma processor, the achievement of the uniform etching requires to rectilinearly move the magnet element from a position corresponding to one end of the surface to-be-processed of the wafer, to a position corresponding to the other end of the same. The space of the plasma processor under the electrode must be large enough to correspond to the size of the magnet element and the movement distance thereof. This leads to the drawbacks that the plasma processor inevitably becomes large in size and that the occupation area of a floor for installing the processor increases.

SUMMARY OF THE INVENTION

An object of the present invention is to provide a plasma processor which suppresses increase in a space required for the movement of means to establish a magnetic field orthogonal to an electric field, thereby making it possible to miniaturize the processor and to suppress increase in the occupation area of a floor for installing the processor, and which can render the processing of a sample uniform.

The present invention consists in a plasma processor comprising a processing chamber, means to reduce a pressure in said processing chamber so as to evacuate it, means to introduce a processing gas into said processing chamber, means to produce an electric field within said processing chamber, and means to establish a magnetic field orthogonal to the electric field, the last-mentioned means being rotatable relative to a surface to-be-processed of a sample which is processed in a plasma generated under the action of the electric field and the magnetic field, thereby to suppress increase in a space required for the movement of said means to establish the magnetic field orthogonal to the electric field, and to be processed uniformly on the surface of the sample using rotatable plasma.

DESCRIPTION OF THE PREFERRED EMBODIMENTS

Embodiments of the present invention will now be described by exemplifying parallel plate type dry etching apparatuses as plasma processors.

First, one embodiment of the present invention will be described with reference to FIGS. 1 to 3.

Figure 1:
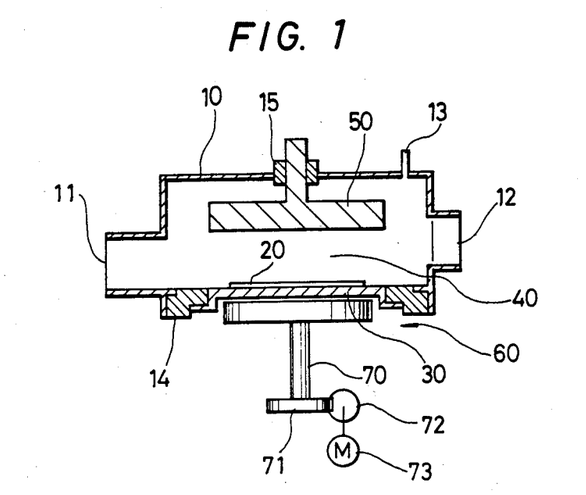
FIG. 1 is a vertical sectional view of the processing chamber portion of a parallel plate type dry etching apparatus showing one embodiment of a plasma processor according to the present invention.

In FIG. 1, the side walls of a processing chamber 10 are formed with a carrying in/out port 11 for a wafer 20 being a sample and an evacuation port 12. For example, a sub vacuum chamber (not shown) is joined to the carrying in/out port 11 through, for example, a gate valve (not shown). Known transport means (not shown) is provided which transports the wafer 20 between the sub vacuum chamber and the processing chamber 10 through the gate valve. The evacuation port 12 is coupled to evacuation means (not shown) through an evacuation pipe (not shown). The top wall of the processing chamber 10 is formed with a gas supply port 13. The gas supply port 13 is coupled to a gas source (not shown) through a supply pipe (not shown) which is provided with gas flow control means (not shown). At the bottom of the processing chamber 10, an electrode 30 whose surface for placing the wafer thereon is situated above is substantially horizontally disposed through an insulator member 14 so as to construct a part of the processing chamber 10. The electrode 30 is connected to a power source, for example, a radio frequency power source (not shown), which is disposed outside the processing chamber 10. A discharge space 40 is defined within the processing chamber 10 and over the wafer placing surface of the electrode 30, and a counter electrode 50 is substantially horizontally disposed while being insulated from the processing chamber 10 by an insulator member 15. The counter electrode 50 is grounded. At a position corresponding to the surface to-be-processed of the wafer 20, in this case, a position coresponding to the opposite surface to the wafer setting surface of the electrode 30, a magnet element 60 is disposed so as to be rotatable within a plane orthogonal to an electric field. The magnet element 60 is coaxial with, for example, the wafer setting surface of the electrode 30 and is fixed to the upper end of a rotary shaft 70. The rotary shaft 70 is coaxial with the magnet element 60, and is provided with a gear 71 at the lower end thereof. A gear 72 is held in mesh with the gear 71, and is coupled to a motor 73.

Figure 2:
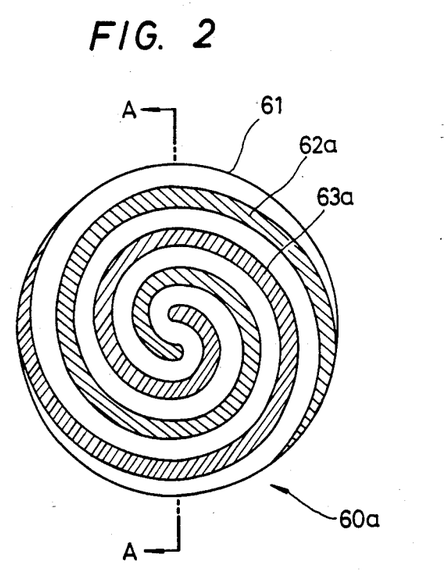
FIG. 2 is a plan view of a magnet element in FIG. 1.
Figure 3:
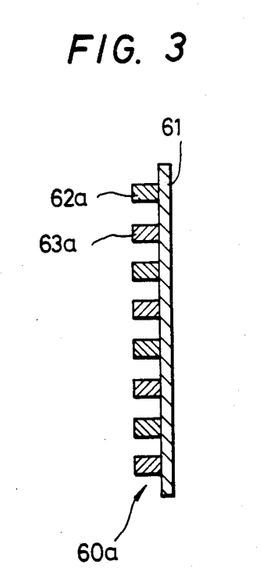
FIG. 3 is a sectional view seen along A—A in FIG. 2.

In FIGS. 2 and 3, a magnet element 60a is constructed of a yoke 61 being a magnet fixing plate and an N-pole 62a and an S-pole 63a forming a magnet. The pairing N-pole 62a and S-pole 63a are arranged on the yoke 61 so as to spread from the vicinity of the center of the yoke 61 toward the peripheral edge thereof while encircling the center, in this case, in the shape of continuous spirals. As illustrated in FIG. 1, such magnet element 60a with the N-pole 62a and the S-pole 63a located above is disposed at the position corresponding to the surface to-be-processed of the wafer 20 and so as to be rotatable within the plane orthogonal to the electric field.

In FIGS. 1–3, the single wafer 20, for example, is carried from the sub vacuum chamber into the processing chamber 10 through the gate valve as well as the carrying in/out port 11 by the transport means in the state of, for example, a vacuum until it is set on the wafer placing surface of the electrode 30 with its surface to-be-processed facing upwards. Thereafter, the transport means is caused to regress out of the processing chamber 10, and the gate valve is closed. Subsequently, a gas required for the etching of the surface to-be-processed of the wafer 20 is fed from the gas source into the processing chamber 10 via the supply pipe as well as the gas supply port 13 while having its flow rate controlled into a predetermined magnitude by the gas flow control means, and the processing chamber is evacuated from the evacuation port 12 by the operation of the evacuation means. Simultaneously, when electric power is applied from the radio-frequency power source to the electrode 30, the glow discharge arises in the discharge space 40 to produce a plasma. At this time, the N-pole 62a and S-pole 63a of the magnet element 60a are disposed so that the direction of the magnetic field thereof may intersect orthogonally to the electric field established by the electrode 30 and the counter electrode 50. Therefore, an intense plasma is produced at that position over the surface to-be-processed of the wafer 20 which corresponds to the interspace between the N-pole 62a and the S-pole 63a. Since this intense plasma conforms to the arrangement of the N-pole 62a and S-pole 63a, it is formed so as to spread from the vicinity of the center of the surface to-be-processed of the wafer 20 to the periperhal edge thereof while encircling the center. Further, since the magnet element 60a is rotated, the intense plasma region is rotated relative to the surface to-be-processed of the wafer 20. Thus, the surface to-be-processed of the wafer 20 is exposed to the uniform and intense plasma over its whole area, with the result that the surface to-be-processed of the wafer 20 is etched quickly and uniformly. The wafer 20 having been etched is delivered from the electrode 30 to the transport means, and is thereafter transported from the processing chamber 10 to the sub vacuum chamber through the carrying in/out port 11 as well as the gate valve by the transport means. Subsequently, the above operations are performed again to quickly and uniformly etch the surface to-be-processed of another wafer.

With the present embodiment, the following effects can be achieved:

(1) Since a magnet element is rotated at a position corresponding to the surface to-be-processed of a wafer, increase in a space required for the movement of the magnet element can be suppressed, and a dry etching apparatus can be miniaturized. Accordingly, increase in the occupying floor area of the apparatus can be suppressed. Simultaneously therewith, an intense plasma is formed so as to spread from the vicinity of of the center of the surface to-be-procesed of the wafer to the peripheral edge thereof while encircling the center, and the intense plasma region is rotated relative to the surface to-be-processed of the wafer, so that the surface to-be-processed of the wafer is exposed to the uniform plasma over its whole area and that the etching of the surface to-be-processed of the wafer can be rendered uniform.

(2) The size of the magnet element may be such that the intense plasma region covers, at most, the whole area of the surface to-be-processed of the wafer. Therefore, the space required for the installation of the magnet element can be decreased, and the dry etching apparatus can be further miniaturized to that extent.

Figure 4:
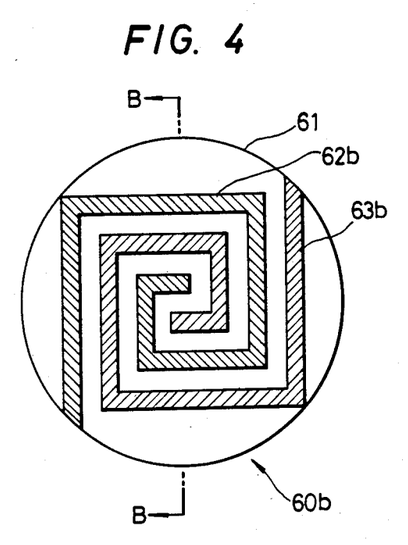
FIG. 4 is a plan view of a magnet element showing the second embodiment of the plasma processor according to the present invention.
Figure 5:
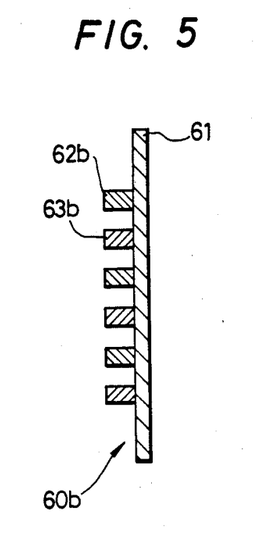
FIG. 5 is a sectional view seen along B—B in FIG. 4.

FIGS. 4 and 5 show the second embodiment of the present invention. The point of difference from FIGS. 2 and 3 showing one embodiment of the present invention is that, in a magnet element 60b, an N-pole 62b and an S-pole 63b forming a pair are disposed on a yoke 61 in the shape of polygons, in this case, quadrilaterals so as to spread from the vicinity of the center of the yoke 61 toward the peripheral edge of the yoke while encircling the center.

With the present embodiment, the following effect can be further attained besides the effects produced by the foregoing embodiment of the present invention.

(1) Since a rod- or plate-shaped magnet can be used, the construction of the magnet element is more simplified.

Figure 6:
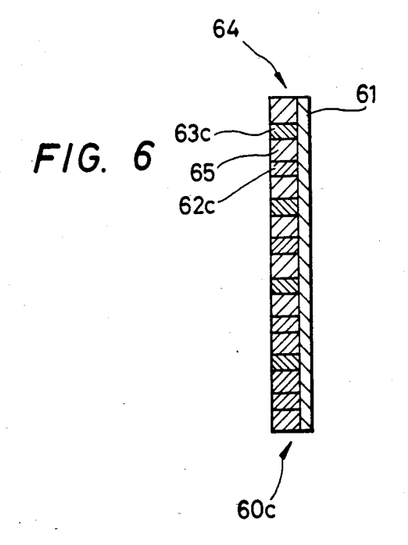
FIG. 6 is a sectional view of the same part of a magnet element as in FIG. 3, showing the third embodiment of the plasma processor according to the present invention.

FIG. 6 shows the third embodiment of the present invention. The point of difference from FIG. 3 showing one embodiment of the present invention is that, in a magnet element 60c, a ferromagnetic material 64 is provided on a yoke 61 and is turned into an N-pole 62c, an S-pole 63c and an unmagnetized region 65 by a magnetization method, thereby to obtain the flat magnet element 60c.

With the present embodiment, the following effect can be further attained besides the effects produced by the foregoing embodiment of the present invention.

(1) Since the magnet element is flat, the provision of an outer surface protective member or protective film for the magnet element, which is executed as may be needed, is facilitated.

Figure 7:
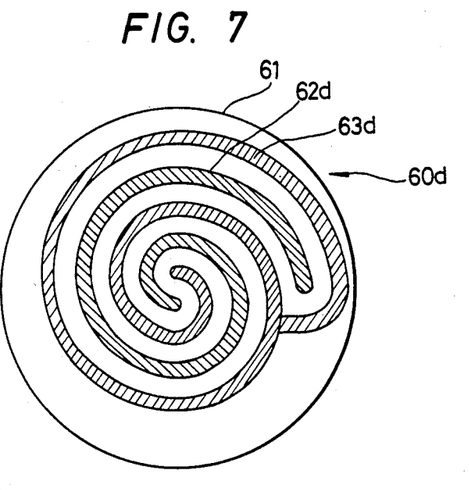
FIG. 7 is a plan view of a magnet element similar to FIG. 2, showing the fourth embodiment of the plasma processor according to the present invention.

FIG. 7 shows the fourth embodiment of the present invention. The point of difference from FIG. 2 showing one embodiment of the present invention is that, in a magnet element 60d, one end of an S-pole 63d is connected to an intermediate part thereof so as for the outermost peripheral part thereof to surround the outermost peripheral end of an N-pole 62d at a predetermined distance.

With the present embodiment, the following effect can be further attained besides the effects produced by the foregoing embodiment of the present invention.

(1) The magnet element falls into a closed magnetic field as a whole, the effect of capturing charged particles by Lorentz forces within the magnetic field rises, and the density of ions or active species in the plasma increases more, so that the etching rate can be further enhanced.

Figure 8:
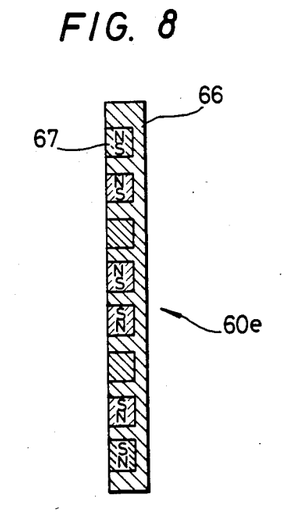
FIG. 8 is a sectional view of the same part of a magnet element as in FIG. 3, showing the fifth embodiment of the plasma processor according to the present invention.

FIG. 8 shows the fifth embodiment of the present invention. The point of difference from FIG. 3 showing one embodiment of the present invention is that a magnet element 60e is constructed of a magnet fixing plate 66 formed of a nonmagnetic material and magnets 67 having N- and S-poles, that recesses in the shape of, for example, continuous spirals making, for example, two paired stripes are formed on one surface side of the magnet fixing plate 66 so as to spread from the vicinity of the center of the magnet fixing plate 66 toward the peripheral edge of the plate while encircling the center, and that the magnets 67 are embedded in the recesses with the N- and S-poles of the adjacent magnets 67 held in correspondence respectively.

With the present embodiment, effects similar to those produced by the foregoing embodiment of the present invention can be attained.

Although, in FIG. 8 showing the fifth embodiment of the present invention, the magnets having the N- and S-poles are embedded as the two stripes in the magnet fixing plate formed of the nonmagnetic material, a single stripe or any other plurality of stripes may well be formed. Besides, magnets having N- and S-poles may well be embedded in a magnet fixing plate in a polygonal shape so as to spread from the vicinity of the magnet fixing plate toward the peripheral edge while encircling the center.

Figure 9:
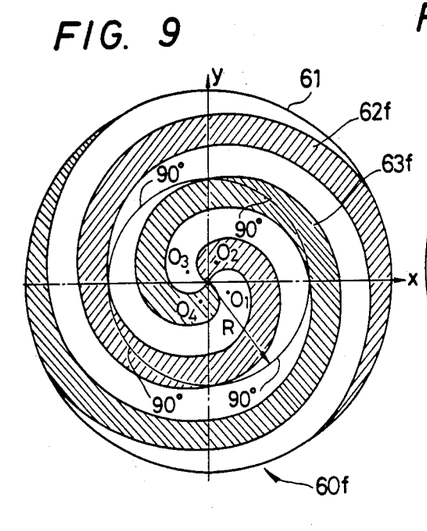
FIG. 9 is a plan view of a magnet element showing the sixth embodiment of the plasma processor according to the present invention.

FIG. 9 shows the sixth embodiment of the present invention. The points of difference from FIG. 2 showing one embodiment of the present invention are that, as seen from FIG. 9, the center of rotation of a magnet element 60f coincides with the center O of four spirals at equal intervals forming an N-pole 62f and an S-pole 63f, and that, in FIG. 9, four quadrants partitioned by x, y-coordinates are connected by circular arcs with reference points being the respective apexes of a regular square $O_1$–$O_4$ whose center is the center O, thereby to construct the N-pole 62f and the S-pole 63f.

With the present embodiment, the following effect can be attained besides the effects produced by the foregoing embodiment of the present invention.

(1) At a position of any radius R from the center O shown in FIG. 9, the magnetic flux density in the radial direction falls within a low range on the N-pole or S-pole (totaling 180 degrees in FIG. 9) and a high range between the N-pole and S-pole (also totaling 180 degrees in FIG. 9), and the average flux density upon one revolution of the magnet element becomes uniform at any position, so that the surface to-be-processed of the wafer area is exposed to a more uniform plasma over the whole area, whereby the uniform etching of the surface to-be-processed of the wafer can be further enhanced.

Figure 10:
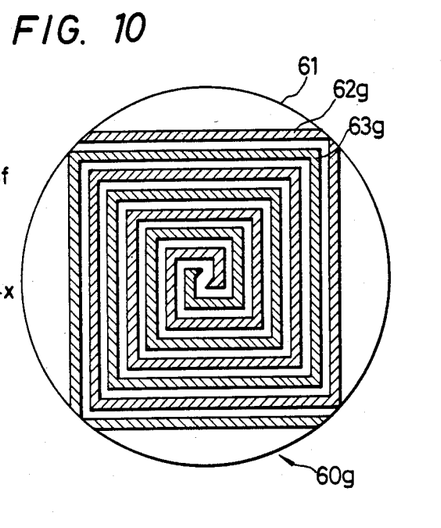
FIG. 10 is a plan view of a magnet element showing the seventh embodiment of the plasma processor according to the present invention.

FIG. 10 shows the seventh embodiment of the present invention. The point of difference from FIG. 9 showing the sixth embodiment of the present invention is that, in a magnet element 60g, an N-pole 62g and an S-pole 63g forming a pair are disposed on a yoke 61 in the shape of polygons, in this case, quadrilaterals so as to spread from the vicinity of the center of the yoke 61 toward the peripheral edge of the yoke while encircling the center and to make the average of flux density distributions upon one revolution of the magnet element uniform at various radial positions.

With the present embodiment, the following effect can be further attained besides the effects produced by the foregoing sixth embodiment of the present invention.

(1) Since a rod- or plate-shaped magnet can be used, the construction of the magnet element is more simplified.

Figure 11:
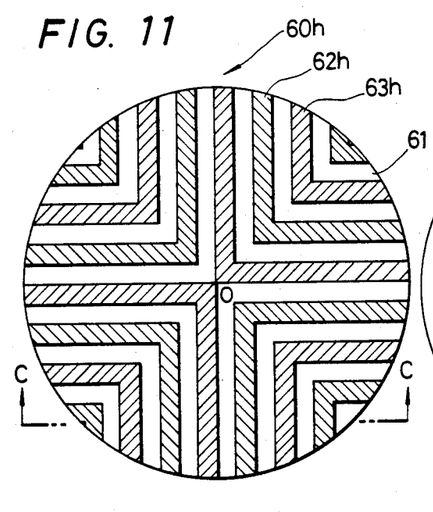
FIG. 11 is a plan view of a magnet element showing the eighth embodiment of the plasma processor according to the present invention.
Figure 12:
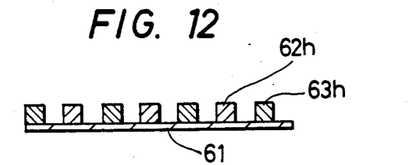
FIG. 12 is a sectional view taken along C—C in FIG. 11.

FIGS. 11 and 12 show the eighth embodiment of the present invention. The points of difference from FIG. 2 showing one embodiment of the present invention are that N-poles 62h and S-poles 63h are disposed on a yoke 61 alternately and in point symmetry to the center O of a magnet element 60h, which is also the center of rotation, and that magnetic poles at both the end of the magnet element 61 are, in this case, the same magnetic poles as the S-poles 63h.

With the present embodiment, the following effect can be attained besides the effects produced by the foregoing embodiment of the present invention.

(1) At positions of any radius from the center of rotation of the magnet element, a range where the magnetic flux density in the radial direction is low on the magnetic pole and a range where it is high between the magnetic poles exit at equal proportions, so that the average flux density distribution in the radial direction upon one revolution of the magnet element becomes equal at any position. Moreover, since the line of magnetic force to arise across both the ends of the magnetic element is not involved, magnetic flux densities of the same magnitude are attained between the individual magnetic poles. Accordingly, the surface to-be-processed of the wafer is exposed to a more uniform plasma, and the uniform etching of the surface to-be-processed of the wafer can be further enhanced.

Figure 13:
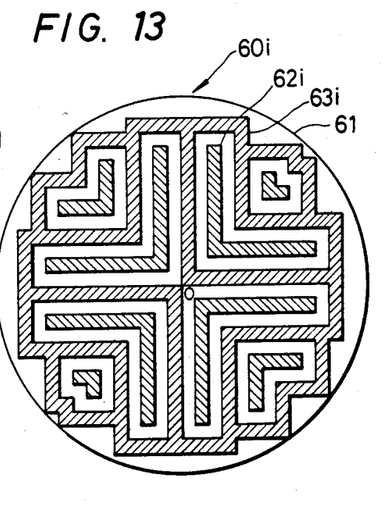
FIG. 13 is a plan view of a magnet element showing the ninth embodiment of the plasma processor according to the present invention.

FIG. 13 shows the ninth embodiment of the present invention. The point of difference from FIG. 11 showing the eighth embodiment of the present invention is that N-poles 62i and an S-pole 63i forming magnets are disposed on a yoke 61 being a magnet fixing plate so as to close the regions between the magnetic poles where an intense plasma is produced.

With the present embodiment, the following effect can be attained besides the effects produced by the foregoing eighth embodiment of the present invention.

(1) Since the intense plasma is always circulated along a closed route, the etching rate of the surface to-be-processed of the wafer can be further enhanced.

Figure 14:
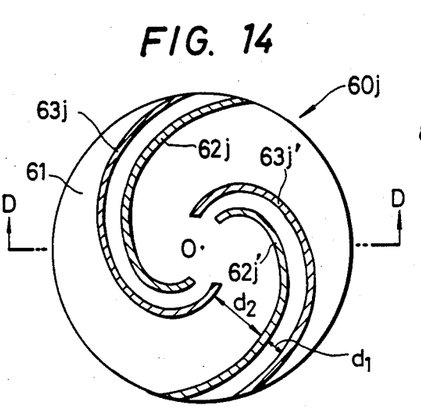
FIG. 14 is a plan view of a magnet element showing the tenth embodiment of the plasma processor according to the present invention.
Figure 16:
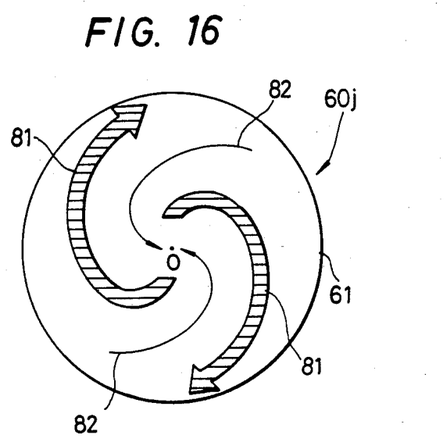
FIG. 16 is a model diagram showing a plasma state produced by the magnet element in FIG. 14.

FIGS. 14 and 16 show the tenth embodiment of the present invention.

Figure 15:
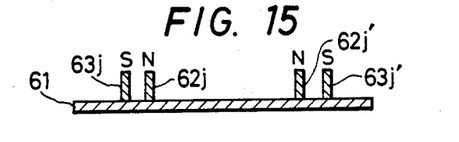
FIG. 15 is a sectional view taken along D—D in FIG. 14.

In FIGS. 14 and 15, a magnet element 60 in FIG. 1 showing one embodiment of the present invention is constructed of magnets 62j, 63j, 62j' and 63j' which are perpendicularly erected on a flat yoke 61. The magnets 63j and 63j' have their S-poles arranged on the front surface side of the magnet element, while the magnets 62j and 62j' have their N-poles arranged on the front surface side. As shown in a plan view of FIG. 14, one end of each of these magnets 62j, 63j, 62j' and 63j' is located in the vicinity of that center O of the yoke 61 which agrees with the center of rotation of the magnet element 60j, and these magnets 62j, 63j, 62j' and 63j' spread peripherally in the shape of scrolls. In addition, the interval $d_1$ between the paired S-pole and N-pole (62j and 63j, or 62j' and 63j') is narrow and has a substantially equal width, and the interval $d_2$ between the adjacent S-pole and N-pole is wider than the interval $d_1$. Accordingly, a magnetic field which has an intense flux density is established in a direction orthogonal to an electric field between the magnets having the width $d_1$, while a magnetic field of medium intensity which is somewhat intenser than a magnetic field just above the magnet is established in the direction orthogonal to the electric field between the magnets having the width $d_2$. Besides, the N-poles 62j and 62j' and the S-poles 63j and 63j' are arranged on the yoke 61 so that, between the magnets having the width $d_1$, the vector product between the electric field and the magnetic field applied at right angles to the corresponding plane may be directed from the center of the yoke 61 toward the outer side thereof, whereas the vector product between the magnetic field and the electric field in the space between the magnets having the width $d_2$ may be directed from the outer periphery of the yoke 61 toward the center thereof. Such magnet element 60j has been constructed on the basis of recognition to be stated below.

Figures 17A, 17B:
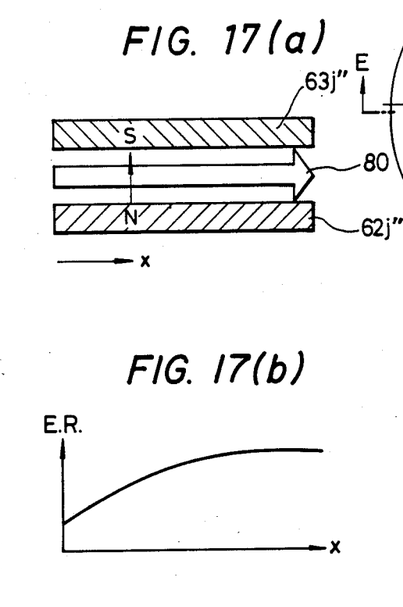
FIGS. 17(a) and 17(b) are diagrams for explaining the principle of the tenth embodiment.

The state of the plasma in the vicinity of the surface to-be-processed of the wafer where the electric and magnetic fields intersected orthogonally was observed scrupulously to find the relationship between the arrangement of the magnets on the yoke and the plasma state in the vicinity of the surface to-be-processed of the wafer, as well as the etching rate of the surface to-be-processed of the wafer. As a result, the presence of a plasma stream phenomenon as illustrated in FIGS. 17(a) and 17(b) has been revealed. In FIG. 17(a), symbol 63j'' denotes an S-pole and symbol 62j'' an N-pole, and an electric field is applied at right angles to the sheet of the drawing. Numeral 80 indicates the direction of a plasma stream. In a place where the density of a plasma is high, the plasma stream flows in the direction of the vector product between the electric field and a magnetic field, namely, in the direction (x-direction in the figure) in which an electron performs a cyclotron motion. As illustrated in FIG. 17(b), the etching rate (E. R.) of the surface to-be-processed of the wafer increases gradually in the direction in which the plasma flows. Uniform processing is accordingly realized when the plasma of high density to flow from the vicintiy of the center of rotation toward the periphery and the plasma of medium density to flow from the periphery into the vicinity of the center of rotation are produced and are rotated. Here, the expression 'plasma of high density' signifies the plasma having the highest plasma density, and the expression 'plasma of medium density' signifies the plasma the density of which is lower than that of the plasma of high density and is higher than that of the plasma in a part that is not affected by the magnetic field.

The plasma in the vicinity of the surface to-be-processed of the wafer based on the electromagnetic field thus established becomes as shown in FIG. 16. In FIG. 16, numeral 81 indicates the plasma of high density which flows from the vicinity of the center of rotation of the magnet element 60j, namely, the center of the yoke 61 to the periphery in the shape of scrolls, and numeral 82 the plasma of medium density which flows from the periphery to the center of the yoke 61 in the shape of scrolls.

With the present embodiment, the following effects can be achieved:

(1) Since a magnet element is rotated at a position corresponding to the surface to-be-processed of a wafer, increase in a space required for the movement of the magnet element can be suppressed, and a dry etching apparatus can be miniaturized. Accordingly, increase in the occupying floor area of the apparatus can be suppressed. Simultaneously therewith, a plasma of medium intensity arises in the vicinity of the center of rotation of the magnet element, and a plasma of high density arises toward the outer periphery thereof in the shape of scrolls, so that a dry etching apparatus of high speed and excellent uniformity is realized by rotating the magnet element.

(2) Since magnets are arranged in the shape of scrolls, the high-density plasma region over the surface to-be-processed of the wafer can be set large in area, and it is possible to raise the rate of etching and to lower a self-bias voltage which determines the irradiation energies of individual ions (to decrease damages to a semiconductor element).

(3) The space required for the installation of the magnet element can be decreased, and the dry etching apparatus can be further miniaturized to that extent.

Figure 18:
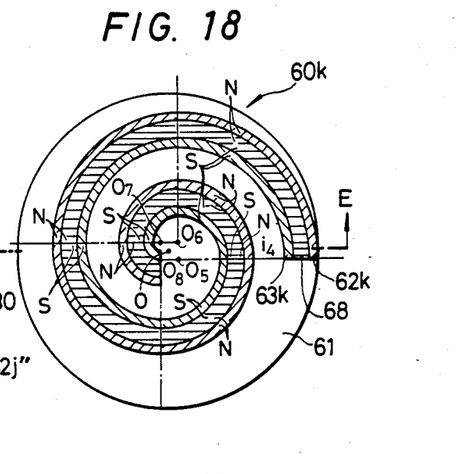
FIG. 18 is a plan view of a magnet element showing the eleventh embodiment of the plasma processor according to the present invention.
Figure 19:
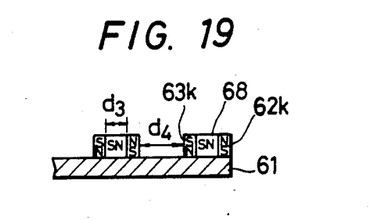
FIG. 19 is a sectional view taken along E—E in FIG. 18.
Figure 20:
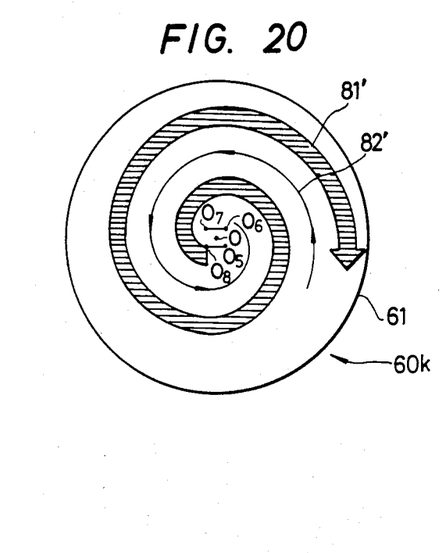
FIG. 20 is a model diagram showing a plasma state produced by the magnet element in FIG. 18.

FIGS. 18 to 20 show the eleventh embodiment of the present invention.

In FIGS. 18 and 19, a magnet element in FIG. 1 showing one embodiment of the present invention is constructed of a yoke 61 and magnets 62$k$ and 63$k$ vertically erected on the yoke 61, as well as a magnet 68 horizontally placed thereon (hereinbelow, termed 'horizontal magnet'). An S-pole and an N-pole are respectively arranged on the front surface sides of the vertically erected magnets 63$k$ and 62$k$, and the horizontal magnet 68 is arranged in agreement with the polarity. All the vertically erected magnets 62$k$, 63$k$ and the horizontal magnet 68 are put into the shapes of scrolls, and they extend from the vicinity of the center O of the yoke 61, which coincides with the center of rotation of the magnet element 60$k$, to the peripheral edge of the yoke 61. Symbols $O_5$–$O_8$ in FIG. 18 denote the points of centers which determine the scroll shapes, which are formed by joining quadrants together. A magnet interval $d_3$ where the horizontal magnet 68 is inserted is narrower than a magnet interval $d_4$ where the horizontal magnet 68 is not inserted, and it is reinforced by the horizontal magnet 68. Therefore, a magnetic field of high flux density is established in a direction orthogonal to an electric field in the space between the magnets having the width $d_3$, while a magnetic field of medium flux density is established in the direction orthogonal to the electric field in the space between the magnets having the width $d_4$.

The plasma in the vicinity of the surface to-be-processed of the wafer based on the electromagnetic field thus established becomes as shown in FIG. 20. In FIG. 20, symbol 81' indicates the plasma of high density which flows from the vicinity of the center of the yoke 61 to the peripheral edge thereof in the shape of a scroll, and symbol 82' the plasma of medium density which flows from the peripheral edge of the yoke 61 to the center thereof in the shape of a scroll.

By rotating the magnet element in this manner, the etching rate can be raised more than in the foregoing case of the tenth embodiment of the present invention, and a nearly equal uniformity can be attained.

Figure 21:
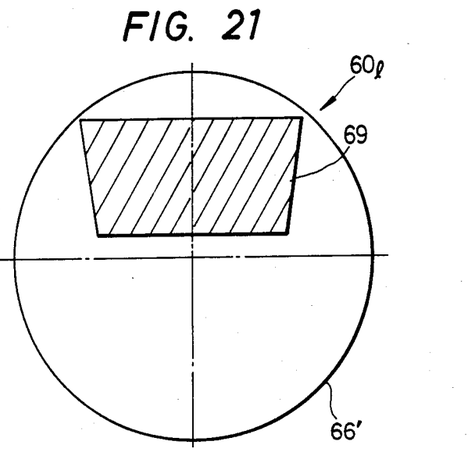
FIG. 21 is a plan view of a magnet element showing the twelfth embodiment of the plasma processor according to the present invention.
Figure 22:
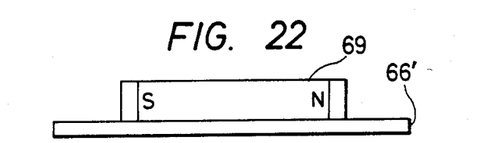
FIG. 22 is a front view of the twelfth embodiment.

FIGS. 21 and 22 show the twelfth embodiment of the present invention.

Referring to FIGS. 21 and 22, a magnet element in FIG. 1 showing one embodiment of the present invention is constructed of a magnet fixing plate 66' and a magnet 69 which is installed on the magnet fixing plate 66' and which generates a magnetic field upwards. In the magnet element 60$l$, the magnet fixing plate 66' is formed of a nonmagnetic material, preferably a diamagnetic material. The shape of the magnet 69 in plan is, in this case, a trapezoid. The magnet 69 is so arranged that the center of rotation thereof exists on the left side when this magnet is viewed in plan in the same direction as that of the line of magnetic force from an N-pole to an S-pole. In this case, the magnet 69 spreads from the center of the magnet fixing plate 66' toward the outer periphery thereof, and an area for trapping electrons increases owing to increase in the area of the magnetic field.

With the present embodiment, the following effects can be achieved:

(1) Since a magnet element is rotated at a position corresponding to the surface to-be-processed of a wafer, increase in a space required for the movement of the magnet element can be suppressed, and a dry etching apparatus can be miniaturized. Accordingly, increase in the occupying floor area of the apparatus can be suppressed. Simultaneously therewith, a magnetic field is established so that the drift direction of electrons may extend from the center of rotation of the magnet element to the outer side thereof, and the magnetic field is relatively rotated in correspondence with the surface to-be-processed of the wafer so as to change the position of a plasma of high density. Therefore, especially when applied to a process in which the etching rate is higher at the central part of the surface to-be-processed of the wafer than at the peripheral edge part thereof, the embodiment can accomplish enhancement in the uniformity of etching, rise in the etching rate and decrease in the damages of a semiconductor element.

(2) The space required for the installation of the magnet element can be decreased, and the dry etching apparatus can be further miniaturized to that extent.

FIGS. 23 to 27 show the thirteenth embodiment of the present invention.

Figure 23:
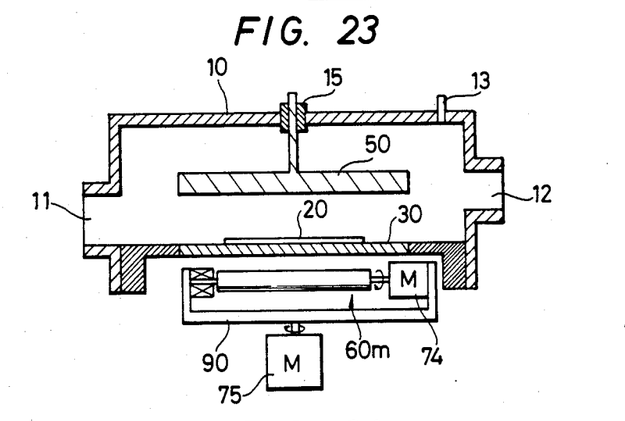
FIG. 23 is a vertical sectional view of the processing chamber portion of a parallel plate type dry etching apparatus showing the thirteenth embodiment of the plasma processor according to the present invention.
Figure 24:
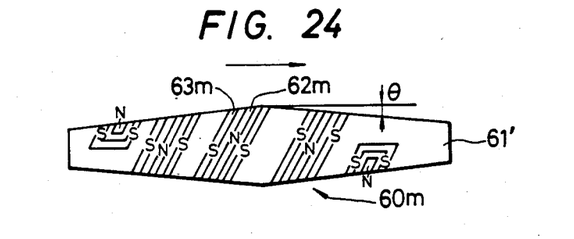
FIG. 24 is a plan view of a magnet element in FIG. 23.
Figure 25:
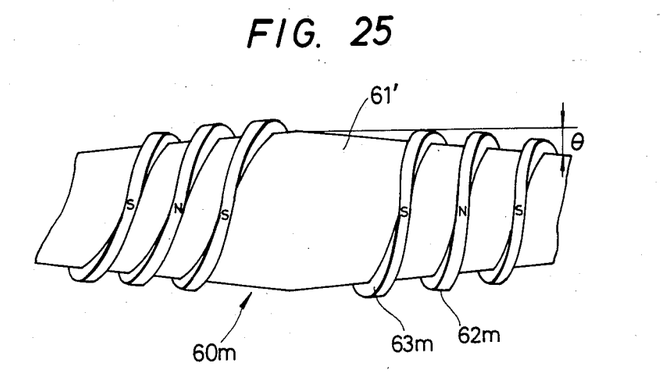
FIG. 25 is a stereographic view of the magnet element in FIG. 23.
Figure 26:
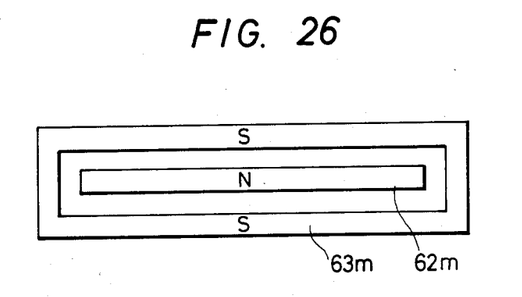
FIG. 26 is an expansion plan of the magnet of the magnet element in FIG. 23 in a magnetic field of closed loop.

In FIGS. 23 to 27, the point of difference from FIG. 1 showing one embodiment of the present invention is that a magnet element 60$m$ is disposed so as to be capable of revolving round an axis at a position corresponding to the surface to-be-processed of a wafer 20, namely, within a plane at right angles to an electric field and to be capable of revolving on its axis which defines right angles to the first-mentioned axis. Another point of difference from FIG. 1 showing one embodiment of the present invention is that magnets 62$m$ and 63$m$ as shown in FIG. 26 are helically wound round a yoke 61' as illustrated in FIGS. 24 and 25.

By way of example, radio frequency power is applied to a sample electrode 30 within a vacuum atmosphere most suited to etching, thereby to generate a plasma owing to the glow discharge. At this time, an intense plasma arises between the individual N-pole 62$m$ and S-pole 63$m$. By rotating the magnet element 60$m$ (on its axis) by means of a motor 74, however, the region of the intense plasma arising between the N-pole 62$m$ and the S-pole 63$m$ moves in the direction of an arrow in FIG.

24. In a case where $\theta=0°$ holds, that is, the distance between the sample electrode 30 and the magnet element 60m is constant, the time-averaged intensities of the plasma in various places of the magnet element 60m become uniform. Besides, by rotating a turntable 90 by means of a motor 75 (rotating the magnet element round the axis of the turntable), the time-averaged intensities of the plasma in various places of the surface to-be-processed of the wafer 20 become uniform.

In a case where $\theta>0°$, that is, the distance between the electrode 30 and the magnet element 60 m differs in the radial direction, the intensity of a magnetic field on the wafer 20 is in inverse proportion to the square of the distance between the magnet element 60m and the electrode 30. Therefore, the time-averaged plasma becomes the intensest at the center of the magnet element 60 m and becomes feebler as the end thereof comes closer. On this occasion, by rotating the turntable 90 by means of the motor 75 (rotating the magnet element round the axis of the turntable), the time-averaged plasma at the center of the surface to-be-processed of the wafer 20 becomes intense, and the time-averaged plasma at the outer peripheral part of the surface to-be-processed becomes feeble. By changing the angle $\theta$, it is possible to control the distribution of the plasma intensities in the radial direction within the surface to-be-processed of the wafer 20 and to control the uniformity of etching processing in the radial direction within the surface to-be-processed of the wafer.

Figure 27:
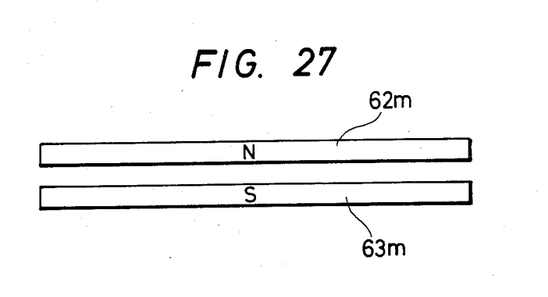
FIG. 27 is an expansion plan of the magnet of the magnet element in FIG. 23 in a magnetic field of open loop.

Although, in the present embodiment, the distance between the electrode and the magnet element is rectilinearly changed, the plasma on the surface to-be-processed of the wafer can be controlled by curvilinearly changing the distance between the electrode and the magnet element. Moreover, although in the present embodiment the magnets each having one pair of N- and S-poles are helically disposed on the magnet fixing member, similar effects are attained even when magnets each having a plurality of pairs of N- and S-poles are helically disposed on the magnet fixing member. In the present embodiment, the combination of S- and N-poles as shown in FIG. 26 is expressed as one pair of magnets in case of a magnetic field of closed loop, and the combination of S- and N-poles as shown in FIG. 27 is expressed as the same in case of a magnetic field of open loop.

Figure 28:
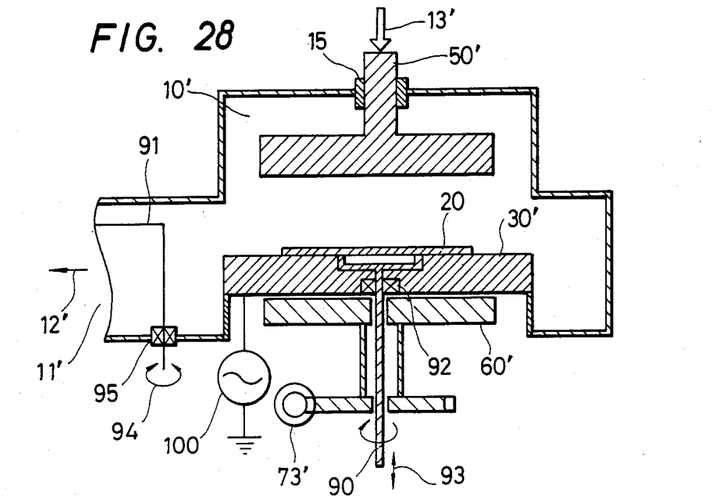
FIG. 28 is a vertical sectional view of the processing chamber portion of a parallel plate type dry etching apparatus showing the fourteenth embodiment of the plasma processor according to the present invention.

FIG. 28 shows the fourteenth embodiment of the present invention.

Referring to FIG. 2, a dry etching apparatus in this case includes therein both the discharge electrodes of opposing electrodes 50' and 30' which are parallel to each other. It comprises a processing chamber 10' which as a supply port 13' and an evacuation port 12' for a gas and a carrying in/out port 11' for a wafer 20, a magnet element 60' which is, for example, rotated and driven by a motor 73', and a wafer push-up pin 90 and a rotary arm 91 which serve as a wafer transport mechanism. More in detail, a radio frequency power source 100 is attached to the electrode 30' and is supported through an insulator. In addition, a seal ring 92 is fitted in the central opening of the electrode 30, to form a structure which is adapted to hold the vacuum of the processing chamber 10' when the wafer push-up pin 90 moves up and down. Numeral 93 indicates an actuaor which moves the wafer push-up pin 90 up and down. Numeral 94 indicates a mechanism for rotating the rotary arm 91, which is vacuum-sealed by a magnetic seal 95.

The magnet element 60' has an opening centrally, and is rotatably supported under the electrode 30' in close proximity thereto (in the atmosphere). This magnet element 60' is, for example, the magnet element as illustrated in FIG. 2 showing one embodiment of the present invention.

The operation of the dry etching apparatus thus constructed will be described below.

The gas necessary for the etching of the wafer 20 is fed from the supply port 13', and the processing chamber 10' is evacuated from the evacuation port 12'. Simultaneously, electric power is applied from the radio frequency power source 100 to the electrode 30', to cause the glow discharge across the electrode 30' and the counter electrode 50', whereby an intense plasma is produced particularly in the vicinity of the wafer 20 in which electric and magnetic fields intersect orthogonally. Since the intense plasma region in the shape of a scroll rotates relative to the surface to-be-processed of the wafer 20, the whole area of the wafer 20 is uniformly exposed to the intense plasma, and the surface to-be-processed thereof is etched at high speed. Upon completion of the processing, the wafer 20 is lifted by the wafer push-up pin 90, and the rotary arm 91 comes under the lower surface of the wafer 20, whereupon the wafer push-up pin 90 descends to deliver the wafer 20 to the rotary arm 91. Thereafter, the rotary arm 91 rotates, passes through the carrying in/out port 11', exchanges the wafer 20 for a new one 20 with an operation similar to the above and then sets this unprocessed wafer 20 on the electrode 30'. In this way, the etching process is repeated.

In the present embodiment, the opening is provided centrally of the magnet element 60'. Since, however, the magnet element 60' performs the rotation unlike the rectilinear motion in the prior-art example, it can be operated with no problem even when the wafer push-up pin 90 is arranged in the opening. It is accordingly possible to provide a magnetron etching apparatus which is easy of transporting the wafer as a sample, which has a high reliability and which is miniaturized.

Figure 29:
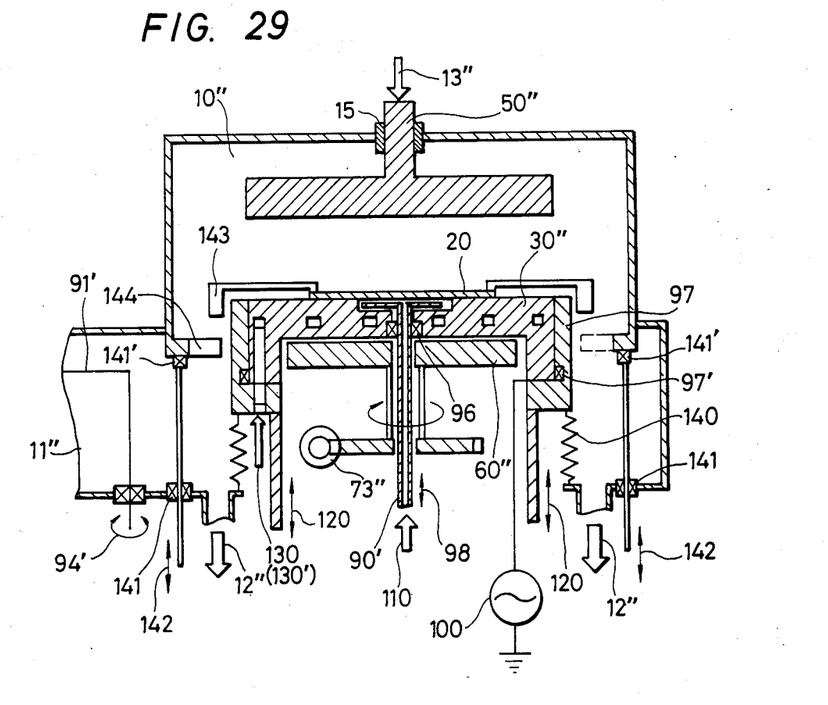
FIG. 29 is vertical sectional view of the processing chamber portion of a parallel plate type dry etching apparatus showing the fifteenth embodiment of the plasma processor according to the present invention.

The fifteenth embodiment of the present invention is shown in FIG. 29. This embodiment is also an application to a dry etching apparatus, and is illustrated in vertical section. Here, symbol 50" denotes a counter electrode, symbol 30" an electrode, symbol 13" a gas inlet port, symbol 12" an evacuation port, symbol 11" a wafer carrying in/out port, symbol 60" a magnet element, symbol 73" a rotating motor, and symbol 20 a wafer. Shown at symbol 90' is a wafer push-up pin which is tubular, and which serves also as a wafer cooling mechanism for passing a coolant gas 110. Numeral 96 designates a seal ring, numeral 97 an insulator, and numeral 97' a seal ring. Numeral 98 designates an actuator for vertically moving the wafer push-up pin 90', numeral 91' a rotary arm, numeral 94' a rotation driving mechanism, and numeral 100 a radio frequency power source. The wafer cooling gas (for example, He gas) 110 passes inside the tube of the wafer push-up pin 90' and is fed under the wafer 20. Shown at numeral 120 is a vertical motion mechanism for the electrode 30", which has a cooling water pipe 130 and the outlet 130' of which is provided in a different direction (not shown). Numeral 140 indicates bellows for holding a vacuum during the vertical motion of the electrode 30", numerals 141 and 141' indicate bellows and seal rings for shutting up a processing chamber 10", and numeral 142 a vertical motion mechanism for the seal ring 141'. Numeral 143 designates a wafer keeper which presses the wafer 20 on the electrode 30" agaisnt the gas pressure under the wafer 20, and numeral 144 a rest which supports the wafer keeper 143 when the electrode 30" has descended.

Different in the present embodiment from the fourteenth embodiment are the cooling mechanism for the wafer and the portions belonging thereto. The electromagnetic field plasma based on the magnet element 60" and the etching mechanism based on the rotation thereof are quite the same.

Now, the wafer cooling and the wafer transport will be described in detail. FIG. 29 illustrates the state in which the electrode 30" has ascended, the wafer keeper 143 has been set on the wafer 20 and the seal ring 141' has shut up the processing chamber 10", whereby the etching is performed. At this time, the He gas is fed into the tube of the wafer push-up pin 90' and fills up the space under the wafer 20, so that the thermal resistance between the wafer 20 and the electrode 30" becomes much lower than the resistance of metal contact in the case where the cooling gas is not fed. Meanwhile, the heat itself of the wafer 20 is subjected to a cooling action very effectively because the cooling water is circulated in the electrode 30".

When the etching has ended, the electrode 30" descends, the wafer keeper 143 is supported on the rest 144, and the seal ring 141' descends. Thereafter, the wafer push-up pin 90' rises to push up the wafer 20, which is exchanged for an unprocessed wafer by the mutual operation with the rotary arm 91' as in the foregoing fourteenth embodiment.

In this manner, according to the present embodiment, it is possible to provide a magnetron etching apparatus which is easy of cooling the wafer and transporting it, which has a high reliability and which is miniaturized.

In the above, the embodiments of the present invention have been described with the objects being the dry etching apparatuses. Here, even when the following alterations are involved, the effects of the present invention do not differ essentially, so that the alterations are naturally included within the scope of the present invention:

(1) Cases where electric power to be applied to a discharge electrode is of low frequency and where it is of D.C.

(2) Case where the electric power is applied to a counter electrode.

(3) Case where an electrode for placing a sample thereon is constructed as an independent electrode inside a processing chamber.

(4) Cases where a gas to be supplied into the processing chamber is an inert gas, where it is an active gas and where it is a mixed gas consisting of both the gases.

(5) Cases where the purpose of processing with a plasma is sputtering and where it is vapor deposition.

(6) Case where the magnet element is disposed either at the counter electrode side or at both sides of the counter electrode and the electrode.

Besides, alternate turning is of course included in the rotation of the magnet element within the plane orthogonal to the electric field.

As described above, according to the present invention, a plasma processor comprises a processing chamber, means to reduce a pressure in said processing chamber so as to evacuate the interior thereof, means to introduce a processing gas into said processing chamber, means to generate an electric field within said processing chamber, and means to establish a magnetic field orthogonal to the electric field, this means being rotatable relative to a surface to-be-processed of a sample which is processed in a plasma arising under an interaction between the electric field and the magnetic field. Thus, increase in a space required for the movement of the means to establish the magnetic field orthogonal to the electric field can be suppressed, so that the apparatus can be miniaturized and that increase in an occupying floor area for installing the apparatus can be suppressed, and the uniform processing of the sample can be attained using rotatable plasma.

What is claimed is:

1. A plasma processor comprising a processing chamber, means to reduce a pressure in said processing chamber so as to evacuate an interior thereof, means to introduce a processing gas into said processing chamber, means to generate an electric field within said processing chamber, and means to establish a magnetic field orthogonal to the electric field, this means being rotatable relative to a surface to-be-processed of a sample which is processed in a plasma arising under an action of the electric field and the magnetic field.

2. A plasma processor as defined in claim 1, wherein said means to establish the magnetic field is disposed rotatable within a plane orthogonal to the electric field relative to the surface to-be-processed of the sample.

3. A plasma processor as defined in claim 2, wherein said means to establish the magnetic field is constructed of a magnet fixing plate and a magnet, and said magnet is disposed on said magnet fixing plate so as to spread toward a peripheral edge of said magnet fixing plate while encircling a center thereof.

4. A plasma processor as defined in claim 2, wherein said means to establish the magnetic field is constructed of a magnet fixing plate and a magnet, and said magnet is disposed on said magnet fixing plate so as to spread toward a peripheral edge of said magnet fixing plate while encircling a center thereof and to make averages of magnetic flux density distributions upon one revolution of said means uniform at various radial positions.

5. A plasma processor as defined in claim 2, wherein said means to establish the magnetic field is constructed of a magnet fixing plate and a magnet, and N- and S-poles of said magnet are disposed on said magnet fixing plate alternately and in point symmetry to a center of rotation of said magnet fixing plate, the magnetic poles at both ends of said means being the same magnetic poles.

6. A plasma processor as defined in claim 2, wherein said means to establish the magnetic field is means to establish a magnetic field whose flux density orthogonal to the electric field varies.

7. A plasma processor as defined in claim 6, wherein said means to establish the magnetic field is constructed of a magnet fixing plate and a magnet, and said magnet is disposed on said magnet fixing plate with an interval of N- ane S-poles thereof varied, thereby to afford the variation of the flux density.

8. A plasma processor as defined in claim 6, wherein said means to establish the magnetic field is constructed of a magnet fixing plate, several magnets perpendicularly erected on said magnet fixing plate, and other magnets, and the other magnets are horizontally disposed between the perpendicularly erected magnets, thereby to afford the variation of the flux density.

9. A plasma processor as defined in claim 2, wherein said means to establish the magnetic field is constructed of a magnet fixing plate and a magnet, and when viewed in plan, said magnet is disposed on said magnet fixing plate so that a center of rotation may exist on a left side in the same direction as that of a line of magnetic force extending from an N-pole to an S-pole of said magnet.

10. A plasma processor as defined in claim 1, wherein said means to establish the magnetic field is disposed so as to be capable of revolving round an axis within a plane orthogonal to the electric field relative to the surface to-be-processed of the sample and revolving on its axis orthogonal to the first-mentioned axis.

11. A plasma processor comprising a processing chamber, means to reduce a pressure in said processing chamber so as to evacuate an interior thereof, means to introduce a processing gas into said processing chamber, means to generate an electric field within said processing chamber, means to establish a magnetic field orthogonal to the electric field, and sample transfer means to transfer a sample between electrodes constituting the electric field generating means, the magnetic field establishing means being provided with an opening and being rotatable relative to a surface to-be-processed of the sample placed on said electrode, said sample transfer means being capable of reciprocating through said opening of said magnetic field establishing means.

12. A plasma processor comprising a processing chamber, means to reduce a pressure in said processing chamber so as to evacuate an interior thereof, means to introduce a processing gas into said processing chamber, means to generate an electric field within said processing chamber, means to establish a magnetic field orthogonal to the electric field, and means to feed a cooling gas to a surface of a sample opposite to a surface to-be-processed of the sample placed on an electrode constituting the electric field generating means, the magnetic field establishing means being rotatable relative to the surface to-be-processed of the sample placed on said electrode.

* * * * *